United States Patent
Casady et al.

(10) Patent No.: US 6,767,783 B2
(45) Date of Patent: Jul. 27, 2004

(54) SELF-ALIGNED TRANSISTOR AND DIODE TOPOLOGIES IN SILICON CARBIDE THROUGH THE USE OF SELECTIVE EPITAXY OR SELECTIVE IMPLANTATION

(75) Inventors: Jeffrey B. Casady, Starkville, MS (US); Geoffrey E. Carter, Saltillo, MS (US); Yaroslav Koshka, Starkville, MS (US); Michael S. Mazzola, Starkville, MS (US); Igor Sankin, Starkville, MS (US)

(73) Assignee: Mississippi State University-Research and Technology Corporation (RTC), Mississippi State, MS (US)

( * ) Notice: Subject to any disclaimer, the term of this patent is extended or adjusted under 35 U.S.C. 154(b) by 0 days.

(21) Appl. No.: 10/193,108

(22) Filed: Jul. 12, 2002

(65) Prior Publication Data

US 2003/0034495 A1 Feb. 20, 2003

Related U.S. Application Data

(60) Provisional application No. 60/304,423, filed on Jul. 12, 2001.

(51) Int. Cl.$^7$ .......................................... H01L 21/8249
(52) U.S. Cl. ................... 438/234; 438/235; 438/236; 438/237; 438/238
(58) Field of Search ................................. 438/235–238

(56) References Cited

U.S. PATENT DOCUMENTS

| 5,350,699 | A | * | 9/1994 | Nii .............................. 437/31 |
| 5,859,447 | A | * | 1/1999 | Yang et al. ................. 257/197 |
| 6,049,098 | A | | 4/2000 | Sato |
| 6,455,364 | B1 | | 9/2002 | Asai et al. |

* cited by examiner

Primary Examiner—Long Pham
(74) Attorney, Agent, or Firm—Piper Rudnick L.L.P.; Steven B. Kelber

(57) ABSTRACT

A method of making vertical diodes and transistors in SiC is provided. The method according to the invention uses a mask (e.g., a mask that has been previously used for etching features into the device) for selective epitaxial growth or selective ion implantation. In this manner, the gate and base regions of static induction transistors and bipolar junction transistors can be formed in a self-aligned process. A method of making planar diodes and planar edge termination structures (e.g., guard rings) is also provided.

27 Claims, 8 Drawing Sheets

SELF-ALIGNED TRANSISTOR AND DIODE TOPOLOGIES IN SILICON CARBIDE THROUGH THE USE OF SELECTIVE EPITAXY OR SELECTIVE IMPLANTATION

CROSS-REFERENCE TO RELATED APPLICATIONS

This application claims priority from U.S. Provisional Application Serial No. 60/304,423 filed Jul. 12, 2001. The entirety of that provisional application is incorporated herein by reference.

BACKGROUND OF THE INVENTION

1. Field of the Invention

This invention applies to advanced SiC devices for high-speed, high-power applications such as compact efficient power amplifiers in radar transmitters in airborne and ground-based radar systems and high-power density switching applications such as high-voltage DC-DC converters and inverters.

2. Background of the Technology

Two of the most common types of vertical SiC power transistors are the Static Induction Transistor (SIT) and the Bipolar Junction Transistor (BJT). These devices are described in more detail below.

The SIT is a vertical MESFET or JFET type device wherein the gates are close together resulting in space charge limited current conduction. The device characteristics look much like a triode rather than a conventional FET. The advantages of using an SIT are a result of its high voltage gain and good impedance characteristics, which result in a high power gain. In SiC, the device performance is further enhanced by the high saturation velocity (e.g., 1.5–2× that of Si) and high electric field breakdown strength (e.g., 10× that of Si). Based on SiC's high thermal conductivity and suitability for use at high-temperatures, a silicon carbide SIT device should produce substantial improvements over Si technology.

An SIT can have either PN or Schottky gates. Additionally, current in an SIT is controlled by the electric field applied to the drain and gate regions. Most SIT's in SiC have used Schottky metal gates. See, for example, U.S. Pat. Nos. 5,945,701; 5,903,020; 5,807,773; and 5,612,547. See also Henning et al., "A Novel Self-Aligned Fabrication Process for Microwave Static Induction Transistors in Silicon Carbide," Electron Device Letters, 21, 578–580 (2000). Using a Schottky gate in an SIT or MESFET will typically limit the junction temperature to about 250° C. because leakage currents exponentially increase through the Schottky gate with increasing temperature.

Much of the early work on the SIT in SiC focused on developing highly uniform, highly controlled epitaxy layers for the drift and channel regions. The early successes of the device were a direct result of improved epitaxy uniformity through the use of wafer rotation and a better understanding of epitaxial growth mechanisms.

Most of the fabrication difficulties currently being experienced in low-cost volume manufacturing can be traced back to the gate-level processing steps. First, the current-carrying capability of the SIT is highly sensitive to the width of the channel regions, which is set by patterned reactive ion etching (RIE). However, after RIE, it is usually necessary to perform thermal oxidation in order to form a high-quality passivation layer over the device. During this step, the oxidation of the sidewall can occur up to five times faster than the planar Si-face of the SiC surface, resulting in variations in the channel width which can be difficult to control precisely. Further, the oxide must be selectively removed from the gate trench bottom and sidewalls, which usually requires wet chemical etching to ensure sidewall oxide removal. This selective removal of oxide along the sidewall is a very challenging step from both an alignment and process point of view.

Once the oxide is removed from the sidewall, the gate Schottky contact can be formed. Due to the very small geometries involved, the gate metal is typically deposited via sputtering, which can induce damage and lower the Schottky barrier, or by angled evaporation. Achieving this coverage, without forming gate-to-source shorts, is extremely difficult as described by Henning, supra.

An additional performance-related problem with the Schottky gate is that the Schottky Barrier metal is deposited on an etched sidewall of SiC. This etched sidewall is not optimal for Schottky deposition, and results in a lowered barrier. Also, the surface is non-planar resulting in a non-planar space charge region in the channel, which can lead to problems with reproducibility or signal fidelity. The non-planar etched sidewall is a result of slight variations in the photolithography pattern. Although it is possible to demonstrate S-band performance with marginal gain, it is clear that an improved process is needed to ensure lower-cost, more reproducible manufacturing of the SiC SIT.

The SiC BJT has been thought to be an attractive device for microwave applications for quite some time. In fact, simulations by R. J. Trew in 1991 indicated that a 6H-SiC BJT with 0.2 $\mu$m thick base doped at $3 \times 10^{18}/cm^3$ could produce useful power up to 4 GHz in a Class A common-emitter configuration. See Trew et al., "The Potential of Diamond and SiC Electronic Devices for Microwave and Millimeter-Wave Power Applications", Proc of the IEEE, 79, 598–620(1991). Optimizing the base resistance while maintaining the needed gain is important. Thinning the base decreases the base transit time but increases the base resistance. Adding to this difficulty is that in SiC, the Al acceptor level is nearly 200 meV from the valence band edge and thus not fully ionized at room temperature.

Also, the p-type base contact can be difficult to fabricate in SiC because of the large bandgap. In fact, low-resistivity contacts to p-type SiC have only been formed on heavily doped p-type SiC. The reasons for this can be understood from the thermal equilibrium band diagram of the metal-semiconductor interface ($q\Phi_M < q\Phi_{SiC}$). In general, the Schottky barrier ($\Phi_B$) to majority carrier transport should be reduced as much as possible to provide for an ohmic contact. Since the bandgap and electron affinity ($\chi$) of SiC are fixed, the remaining options for reducing the $\Phi_B$ are to choose a metal with a large work function ($\Phi_M$) and also to dope the p-type SiC as heavily as possible. P-type ohmic contacts to SiC often use some variation of Al/Ti alloys, and a contact with specific contact resistance of 1.5 $\Omega \cdot cm^2$ on Al-doped samples ($NA=2 \times 10^{19}/cm^3$) has been reported using an Al/Ti alloy. See Crofton et al., "Contact resistance measurements on p-type 6H-SiC", Appl. Phys. Lett., 62, 4, 384–386 (1993). The specific contact resistance is a strong function of doping. Although Al melts at approximately 660° C., a 90:10 Al/Ti alloy (by weight) is a mixture of solid and liquid phase at temperatures of 950 to 1150° C., which are typical anneal temperatures used in the formation of ohmic contacts to SiC. See Crofton, supra. See also N. Lundberg et al., "Thermally stable Low Ohmic Contacts to P-type 6H-SiC using Cobalt Silicides", Solid St. Elect., 39, II, 1559–1565 (1996); and Crofton et al., "Titanium and Aluminum-Titanium Ohmic Contacts to P-Type SiC", Solid St. Elect. (1997).

More recent experiments using a 90:10 Al/Ti alloy have yielded specific contact resistance ranging from $5\times10^{-6}$ to $3\times10^{-5}$ on p-type 6H-SiC doped at $1.3\times10^{19}$/cm. On the same material, pure Ti (with a 1 minute, 800° C. anneal) was also used to form ohmic contacts with specific contact resistance ranging from $2-4\times10^{-5}$ $\Omega\cdot cm^2$. Removal of the metals after annealing revealed that the Al-based contact spiked into the SiC, evidenced by pits in the SiC surface up to 2600 Å deep, while the Ti contact exhibited little interfacial reaction. Thus, although Al-based contacts can yield exceptionally low specific contact resistances, the contact can suffer from poor reproducibility and aluminum oxidation during annealing ($Al_2O_3$). See Crofton (1997), supra and Porter et al., "Issues and Status of Ohmic Contacts to P-type Silicon Carbide", Trans. 3d Int'l. High Temp. Elect. Conf. (HiTEC), Session VII, 3–8 (1996). A more complete summary of these problems can also be found in Casady et al., "Processing of Silicon Carbide for Devices and Circuits," chapter included in "Processing of Wide Bandgap Semiconductors", Pearton (ed), William Andrew Publishing and Noyes Publications, 178–249 (2000) (ISBN 0-8151439-5).

One of the most significant improvements possible is the development of a self-aligned base process with heavily doped p+ spacers, while not invoking current crowding, and further development of the p-type ohmic contact. Although there is a need for heavy doping under the base contact, it is difficult to form this layer too close to the active base region without invoking current crowding through the periphery of the base. Conversely, having the contact too far away from the active region increases the effective intrinsic base resistance, which is detrimental to the high-frequency performance. The intrinsic base resistance is already quite high in a microwave BJT, since a thin base is required to produce a short base transit time ($t_{bb}$), wherein $t_{bb}$ is proportional to the square of the base width. Forming a thin base can require precise epitaxy or implant control and the thin base will naturally have a much higher sheet resistance. Control of the p-type doping in the base with advanced epitaxy growth and processing techniques will be very important to realizing the SiC BJT's full potential as a high-frequency amplifier. The processing demands will be much higher than in the current power switch development efforts involving SiC BIT's. See, for example, Ryu et al., "1800 V, 3.8A Bipolar Junction Transistors in 4H-SiC", IEEE Dev. Res. Conf. (2000).

It would therefore be desirable fabricate SiC semiconductor devices such as static induction transistors and bipolar junction transistors using a self-aligned process.

SUMMARY OF THE INVENTION

According to a first aspect of the invention, a method of making a silicon carbide bipolar junction transistor is provided. According to this aspect of the invention, the bipolar junction transistor comprises a SiC semiconductor substrate layer of a first conductivity type, a SiC drift layer of the first conductivity type disposed on the substrate layer, a SiC base layer of a second conductivity type different than the first conductivity type disposed on the drift layer, and one or more SiC emitter regions of the first conductivity type disposed on the base layer. The method according to this aspect of the invention comprises: forming a SiC emitter layer on the base layer, wherein the base layer is disposed on the drift layer and wherein the drift layer is disposed on the substrate layer; positioning a mask on the emitter layer; selectively etching the emitter layer through openings in the mask to form raised emitter regions separated by etched regions; and selectively forming SiC base contact regions in the etched regions through the openings in the mask.

According to a second aspect of the invention, a method of making a silicon carbide bipolar junction transistor is provided. According to this aspect of the invention, the silicon carbide bipolar junction transistor comprises a SiC semiconductor substrate layer of a first conductivity type, a SiC drift layer of the first conductivity type disposed on the substrate layer, a SiC base layer of a second conductivity type different than the first conductivity type disposed on the drift layer, and one or more SiC emitter regions of the first conductivity type disposed on the base layer. The method according to this aspect of the invention comprises: positioning a mask on the base layer, wherein the base layer is disposed on the drift layer and wherein the drift layer is disposed on the substrate layer; and selectively depositing SiC of the first conductivity type on the base layer through openings in the mask to form the emitter regions.

According to a third aspect of the invention, a method of making a silicon carbide static induction transistor is provided. According to this aspect of the invention, the static induction transistor comprises a SiC semiconductor substrate layer of a first conductivity type, a SiC drift layer of the first conductivity type disposed on the substrate layer, a plurality of SiC gate regions of a second conductivity type different than the first conductivity type disposed on the drift layer, and a plurality of SiC source regions of the first conductivity type disposed on the drift layer. The method according to this aspect of the invention comprises: forming a source layer of SiC of the first conductivity type on the drift layer, wherein the drift layer is disposed on the substrate layer; positioning a mask on the source layer; selectively etching the source layer thorough openings in the mask to form raised source regions separated by etched regions; and selectively forming the SiC gate regions in the etched regions through the openings in the mask.

According to a fourth aspect of the invention, a method of making a silicon carbide semiconductor device is provided. According to this aspect of the invention, the semiconductor device comprises a SiC semiconductor substrate layer of a first conductivity type, a SiC drift layer of the first conductivity type disposed on the substrate layer, and one or more regions of SiC of a second conductivity type different than the first conductivity type disposed on the drift layer. The method according to this aspect of the invention comprises: positioning a mask on the drift layer, wherein the drift layer is disposed on the substrate layer; selectively etching into the drift layer through openings in the mask to form etched regions; and depositing SiC of the second conductivity type in the etched regions through the openings in the mask to form the SiC regions of the second conductivity type.

According to a fifth aspect of the invention, a method of making a silicon carbide semiconductor device is provided. According to this aspect of the invention, the semiconductor device comprises a SiC semiconductor substrate layer of a first conductivity type, first and second SiC drift layers of the first conductivity type disposed on the substrate layer, and one or more SiC gate regions of a second conductivity type different than the first conductivity type formed between the first and second drift layers. The method according to this aspect of the invention comprises: positioning a mask on the first drift layer, wherein the first drift layer is disposed on the substrate layer; selectively implanting ions into the first drift layer through openings in the mask to form the gate regions; removing the mask; and forming the second drift layer on the implanted surface of the first drift layer to form embedded gate regions. One or more source regions of SiC of the first conductivity type can then be formed on the exposed surface of the second drift layer.

BRIEF DESCRIPTION OF THE DRAWINGS

The present invention may be better understood with reference to the accompanying drawings in which.

DESCRIPTION OF THE PREFERRED EMBODIMENTS

Prior device structures in SiC utilize minimal techniques, if any, for forming self-aligned structures. The present inventors have discovered that self-aligned structures can be used to optimize the performance of vertical transistors or thyristors in SiC. Self-aligned structures according to the invention can allow for lower manufacturing costs, lower gate resistance, lower gate-to-source and gate-to-drain capacitances, and increased speed and efficiency. Further, the vertical transistor design concepts which are disclosed herein do not require the use of ion implantation which is an expensive process step requiring a subsequent high-temperature anneal.

A method of making vertical diodes and transistors in SiC is provided. The method according to the invention uses a mask for selective epitaxial growth or selective ion implantation. According to a preferred embodiment of the invention, the mask can be used for etching features in the device prior and the same mask can then be used for selective epitaxial growth or selective ion implantation. In this manner, the gate and base regions of SiC semiconductor devices such as SIT's and BJT'S can be formed in a self-aligned process.

According to a first embodiment of the invention, the gates of an SIT can be formed as buried layers by re-growing an n-type epitaxial layer on top of implanted gate regions and making contact to the implanted or embedded gate regions with vias. By using a buried or embedded gate, the gate to source capacitance ($C_{gs}$) of the device can be reduced. In this manner, semiconductor devices having both high gate resistance and reduced capacitance can be made.

Figure 1A:
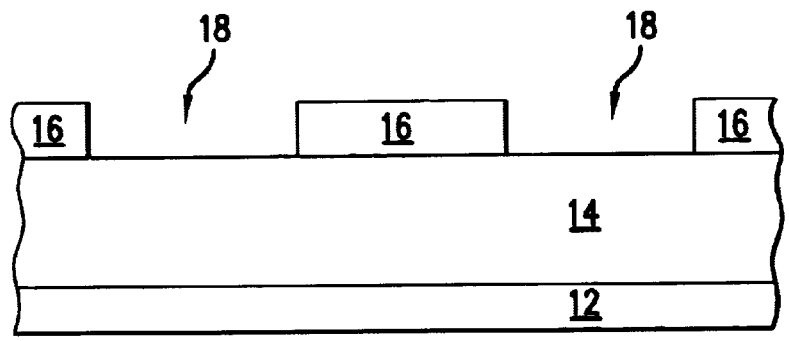
FIGS. 1A–1C illustrate the manufacture of a SiC static induction transistor (SIT) having embedded implanted gate regions according to the invention.
Figure 1B:
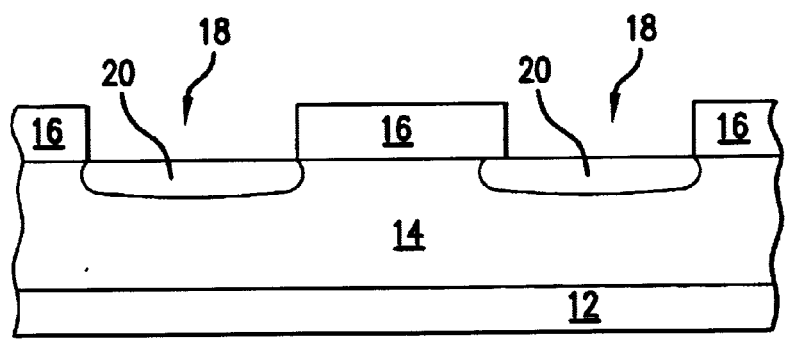
Figure 1C:
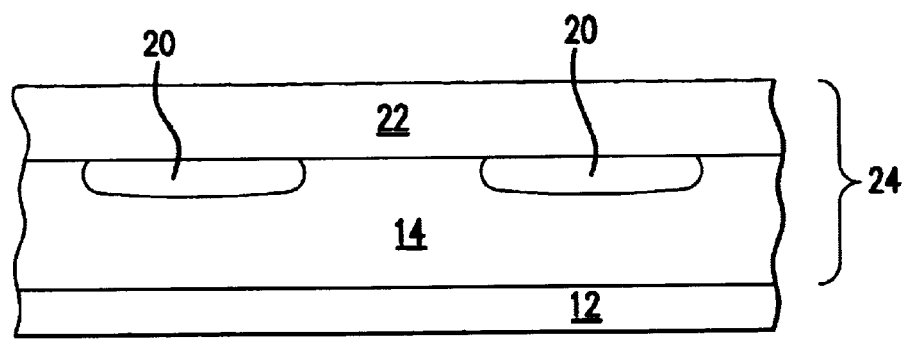

A method of forming an SIT with buried implanted gate regions according to the invention is illustrated in FIGS. 1A–1C. As shown in FIG. 1A, a SiC drift layer 14 is disposed on a SiC substrate layer 12. The substrate layer 12 is typically heavily doped with donor or acceptor atoms. SiC substrates are commercially available from various sources, including Cree, Inc. or Durham, N.C. The drift layer 14 can be formed by epitaxial growth on the underlying substrate layer 12 wherein dopants are incorporated into the drift layer 14 during growth. According to a preferred embodiment of the invention, the doping level of the drift layer 14 is lower than the doping level of the substrate layer 12. The doping levels of the various layers according to the invention can be varied to achieve desired device characteristics.

A mask 16 is then disposed on the exposed surface of the drift layer. The mask has openings 18 leaving portions of drift layer 14 exposed. As shown in FIG. 1B, openings 18 in mask 16 allow drift layer 14 to be selectively implanted to form regions 20 having a conductivity type different than that of the drift layer. For example, if the drift layer is n-type, p-type regions can be selectively formed therein using selective ion implantation through openings 18 in mask 16 according to the invention.

Once these regions of different conductivity type 20 have been formed, mask 16 can be removed and an additional layer of SiC material 22 can be grown thereon as shown in FIG. 1C. According to a preferred embodiment of the invention, layer 22 will have the same conductivity type as drift layer 14. Additionally, layer 22 preferably has approximately the same doping level as layer 14. Layers 14 and 22 together can form a drift layer 24 having embedded therein regions 20 of a different conductivity type.

Embedded regions 20, for example, can form a gate for a static induction transistor. A pn junction SIT can be made by forming one or more source regions of heavily doped SiC of the same conductivity type as the drift layers 14, 22 and substrate layer 12 on the exposed surface of layer 22. Source regions (not shown) can be formed on layer 22 by deposition and patterning using conventional techniques or via selective deposition (i.e., using a mask). One or more vias can then be provided through layer 22 to allow electrical contact with embedded regions 20. Schottky type SITs can also be made according to the invention by depositing a Schottky contact on the exposed surface of layer 22.

A drain ohmic contact (not shown) can then be provided on substrate layer 12 and a source ohmic contact (not shown) can be provided on the source regions to form the SIT device.

According to a further embodiment of the invention, one or more gate regions can be formed by (e.g., by ion implantation or by epitaxial growth) in the recesses forming the source regions of an SIT. For example, source regions can be etched using an etch mask and the gate regions can be grown or formed by ion implantation in the etched recesses through the openings in the mask. According to a preferred embodiment, the gate can be grown selectively through the openings in a source etch mask, which could then be used to grow the p-type gate region selectively in only the gate areas of the SIT.

Figure 2A:
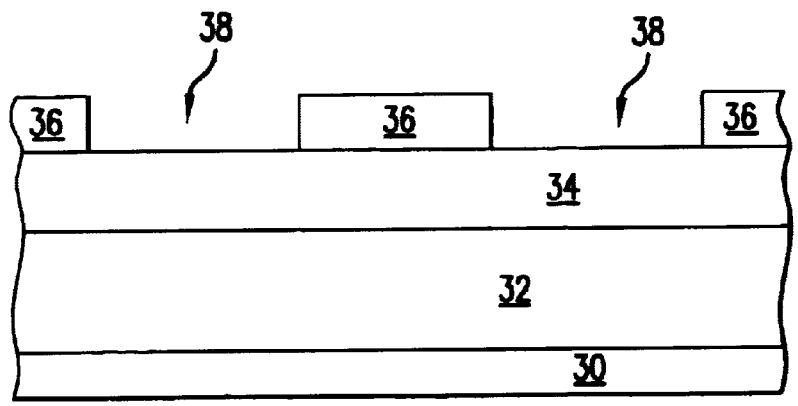
FIGS. 2A–2D illustrate the manufacture of a PN gated SiC static induction transistor (SIT) having quasi self-aligned implanted gate regions according to the invention.
Figure 2B:
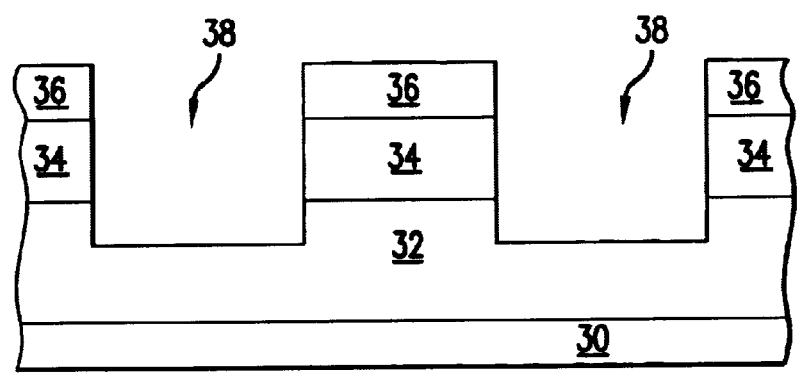
Figure 2C:
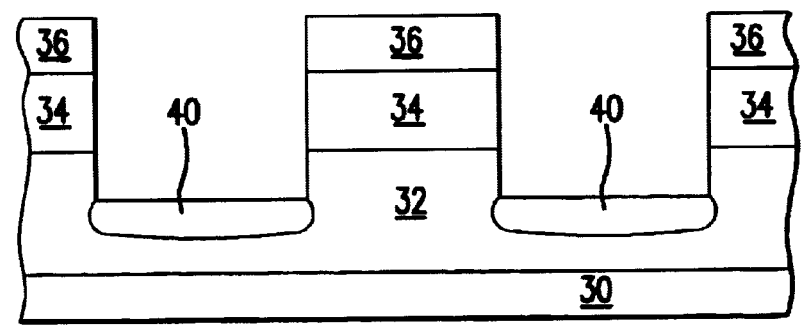

A method of making a a PN gated SIT in SiC using selective re-growth of the gate regions according to the invention is illustrated in FIGS. 2A–2D. As shown in FIG. 2A, a SiC substrate layer 30 having a drift layer 32 and a source layer 34 of the same conductivity type disposed thereon is provided. A mask 36 is then disposed on the source layer 34. As shown in FIG. 2B, source features (e.g., fingers) are then selectively etched through source layer 34 and into drift layer 32 through openings 38 in the mask. As shown in FIG. 2C, the same etch mask 36 can then be used as an implant mask to selectively form gate regions 40 using an ion implantation process.

Figure 2D:
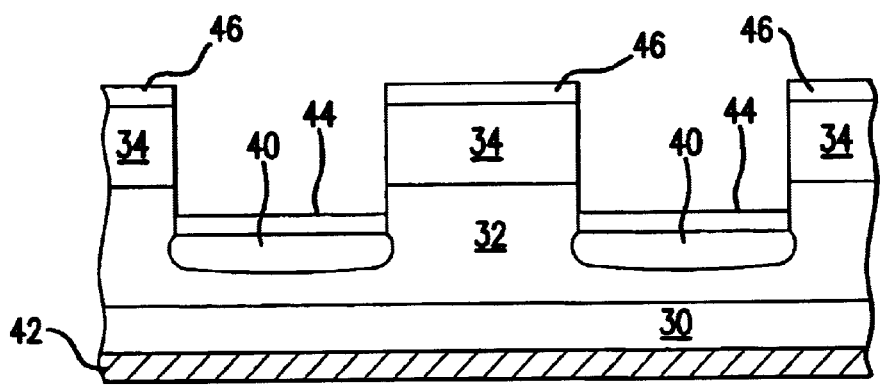

After formation of implanted gate regions 40, mask 36 can be removed and drain contact 42 can be disposed on substrate layer 30 as shown in FIG. 2D. Additionally, as also shown in FIG. 2D, gate ohmic contacts 44 can be disposed on implanted gate regions 40 and source ohmic contacts 46 can be disposed on unetched portions of source layer 34 to form the SIT.

A method of making a PN gated SIT in SiC using selective epitaxial growth of the gate regions according to the invention is illustrated in FIG. 3. As shown in FIGS. 3A and 3B, raised source features 47 (e.g., fingers) are etched with a mask 36 in a similar process to that illustrated in FIGS. 2A and 2B. As shown in FIG. 3C, the same etch mask 36 is then used to selectively grow gate regions 48 in the etched recesses between source features 47. The gate regions can be selectively grown, for example, using an epitaxial growth process (e.g., CVD epitaxy).

Figure 3A:
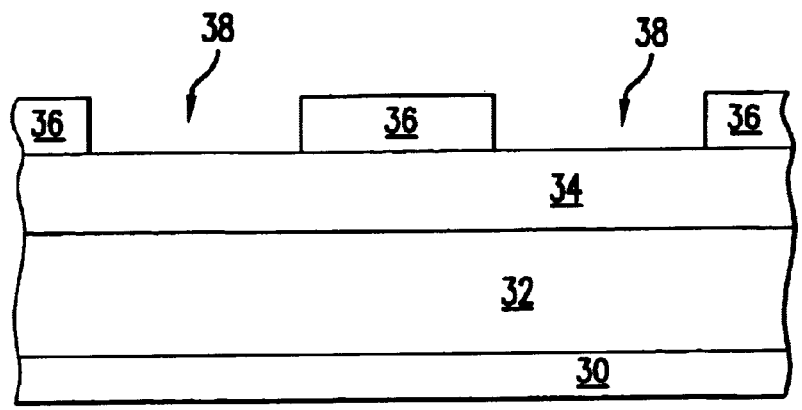
FIGS. 3A–3D illustrate the manufacture of a PN gated SiC static induction transistor (SIT) having quasi self-aligned re-grown gate regions according to the invention.
Figure 3B:
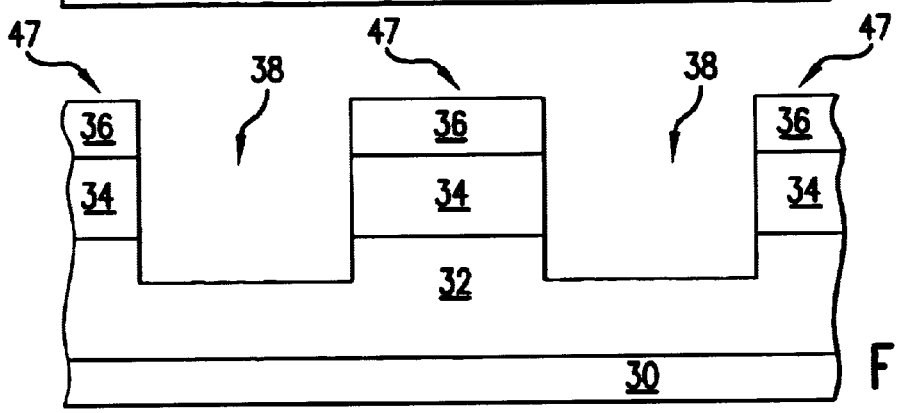
Figure 3C:
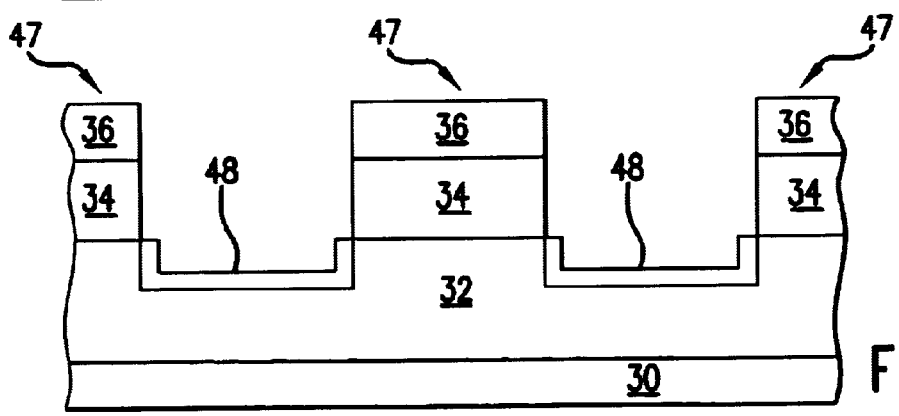
Figure 3D:
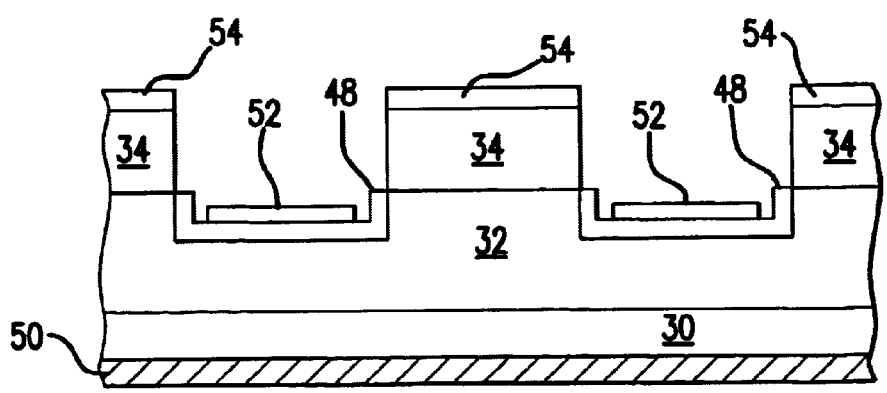

After formation of implanted gate regions 40, mask 36 can be removed and drain contact 50 can be disposed on substrate layer 30 as shown in FIG. 3D. Additionally, as also shown in FIG. 3D, gate ohmic contacts 52 can be disposed on epitaxially grown gate regions 48 and source ohmic contacts 54 can be disposed on unetched portions of source layer 34 to form the SIT.

The structures shown in FIGS. 2D and 3D are both quasi-self-aligned in that the gate regions are formed (i.e., by implantation or epitaxial growth) through the same etch mask used to form the source features.

The etch mask according to the invention can be made of molybdenum, niobium, rhenium, carbon, aluminum nitride (AlN), or other high-temperature materials which can withstand the etching and subsequent epitaxial growth process conditions. Barrier layers between the mask and SiC may be used in the case of metal etch masks to prevent reactions between the metal and SiC materials. Exemplary barrier layers include AlN or $Si_3N_4$. According to a preferred embodiment of the invention, the mask is made from molybdenum.

A SiC bipolar junction transistor (BJT) can also be made according to the invention. A BJT according to the invention preferably has a heavily doped extrinsic base or base contact region in addition to a thin base region since thin base regions suffer from high sheet resistance. The inclusion of an extrinsic base region can therefore lower the resistance of the base. The extrinsic base regions, however, should be carefully designed to keep sidewall capacitance from increasing too much, as well as to maintain a sufficiently high emitter-base breakdown voltage and to prevent current crowding around the base periphery.

A quasi-self-aligned base implant can be made according to the invention by defining (e.g., by etching) emitter regions (e.g., fingers) and implanting or re-growing heavily doped base contact regions using the same mask, similar to the process described in FIGS. 2 and 3 for a SiC SIT. According to a preferred embodiment of the invention, the emitter regions are defined using an etching (e.g., a plasma etching) process.

Figure 4A:
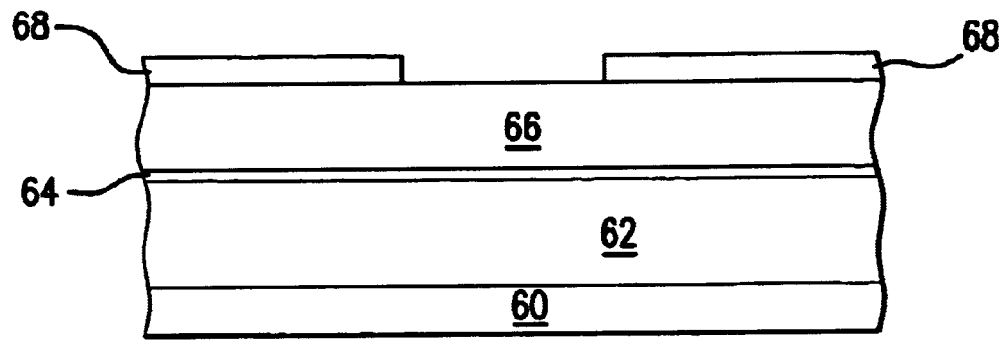
FIG. 4A–4C illustrate the manufacture of a SiC bipolar junction transistor (BJT) having quasi self-aligned re-grown base contact regions according to the invention.
Figure 4B:
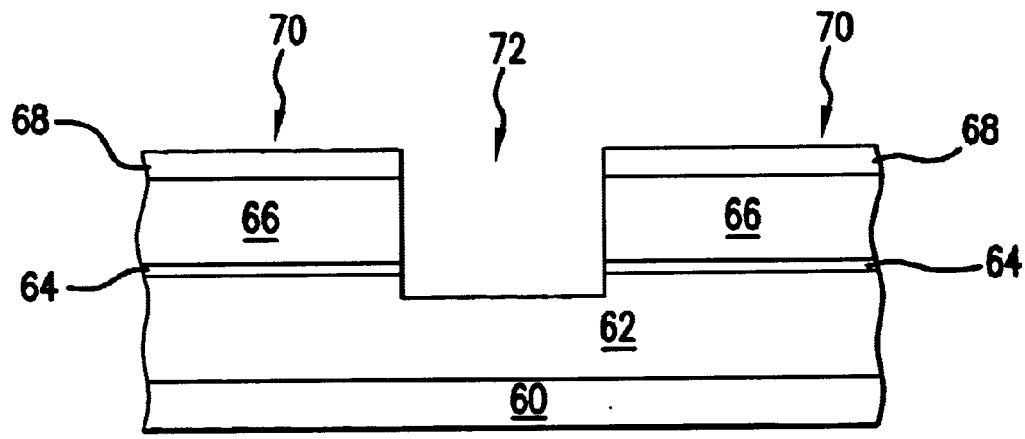
Figure 4C:
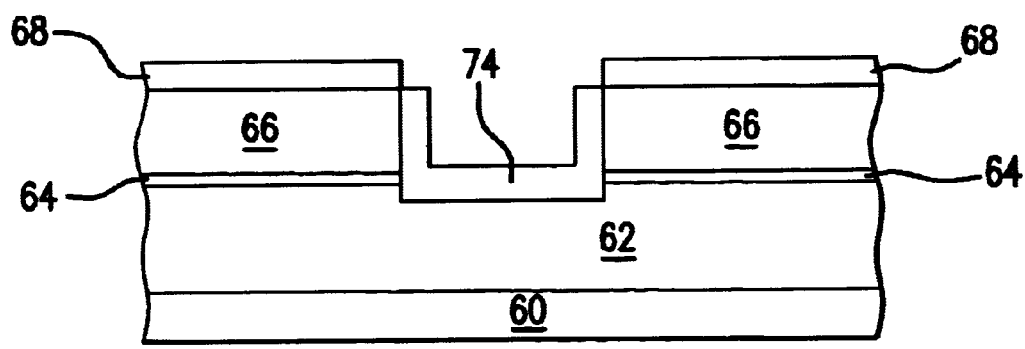

A method of making a SiC BJT having a re-grown base contact region is illustrated in FIGS. 4A–4C. As shown in FIG. 4A, a substrate layer 60 has disposed thereon a drift layer 62, a thin base layer 64 and an emitter layer 66. A mask 68 is shown positioned on the exposed surface of emitter layer 66. In FIG. 4B, emitter regions 70 are shown etched in emitter layer 66 and underlying thin base layer 64 through an opening 72 in mask 68. After etching, a base contact layer 74 is deposited in the etched recess.

Figure 5A:
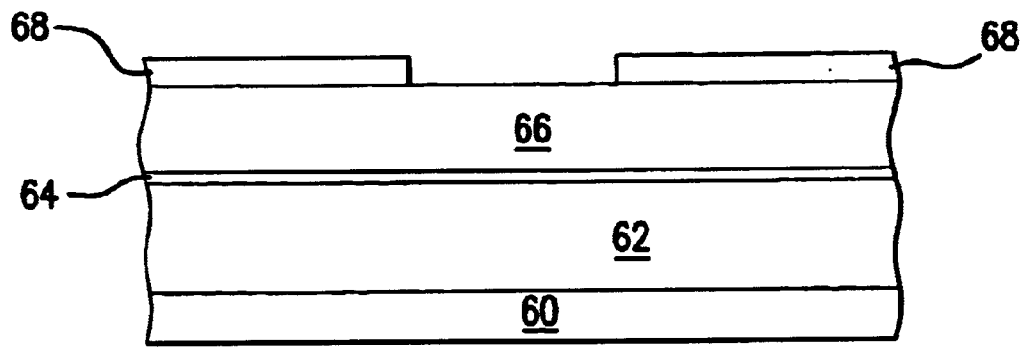
FIGS. 5A–5C illustrate the manufacture of a SiC bipolar junction transistor (BJT) having quasi self-aligned implanted base contact regions according to the invention.
Figure 5B:
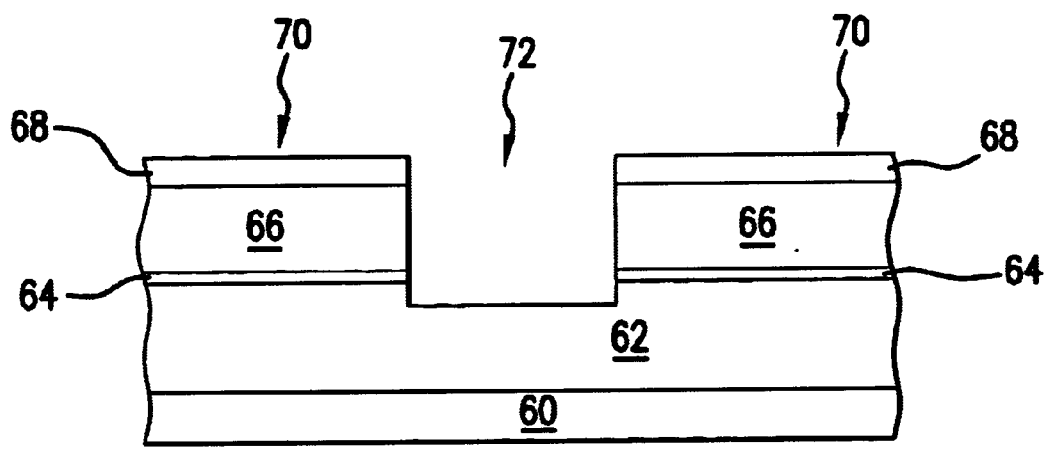
Figure 5C:
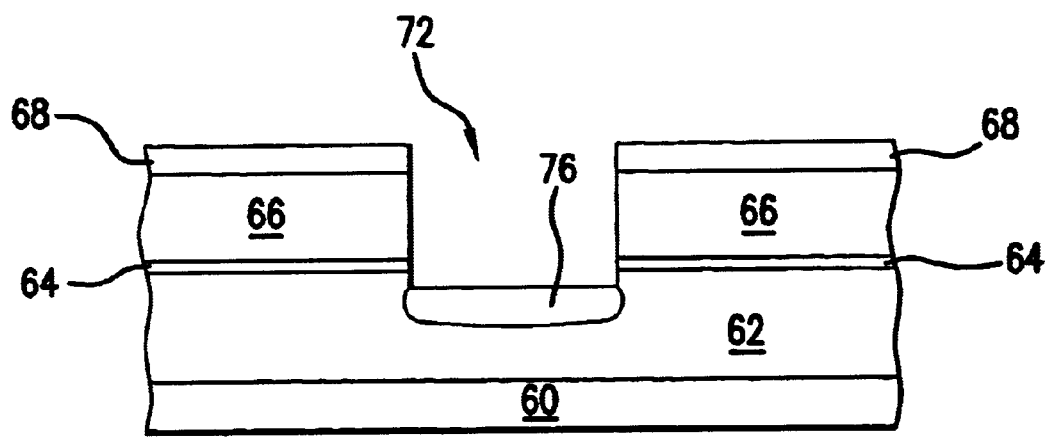

Similarly, the base contact region can be formed by ion implantation as illustrated in FIGS. 5A–5C. A SiC BJT having a base contact or extrinsic base region 76 made by ion implantation is shown in FIG. 5C.

Other embodiments for making a BJT according to the invention include selective growth of the emitter. For example, an n+ epi layer can be grown on the thin p-base layer in an npn device or, alternatively, a p+ epi layer can be grown on a thin n-base layer in a pnp device. This would allow for one to make contact to the thin base region under the emitter without the need to etch SiC back, and thus possibly etch into or through the thin base region.

Figure 6A:
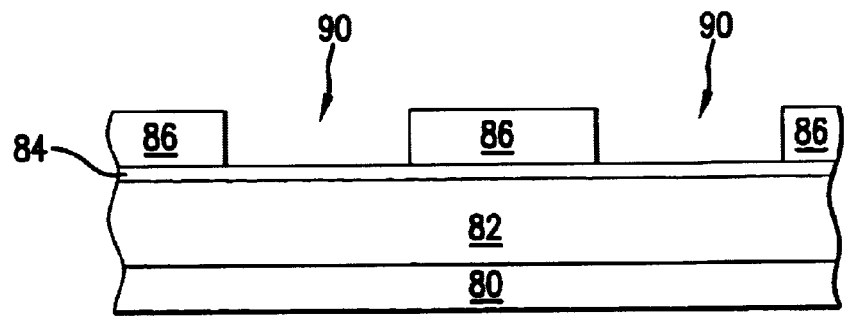
FIGS. 6A–6C illustrate the manufacture of a SiC bipolar junction transistor (BJT) made by selective growth of emitter regions using a mask.
Figure 6B:
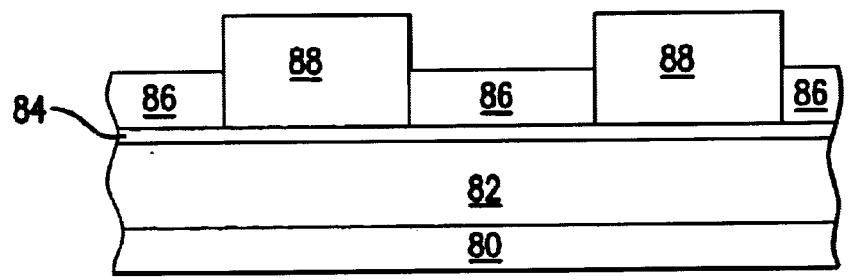
Figure 6C:
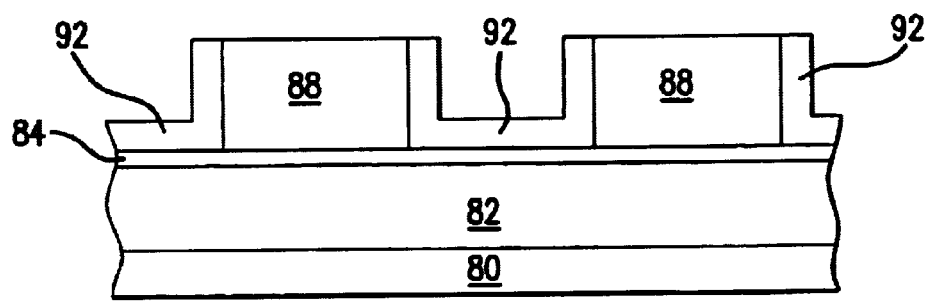

A method of making a silicon carbide BJT by selective growth of the emitter regions is illustrated in FIG. 6. As shown in FIG. 6A, a substrate layer 80 has disposed thereon a drift layer 82, and a thin base layer 84. A mask 86 is shown positioned on the exposed surface of thin base layer 84. In FIG. 6B, emitter regions 88 are shown epitaxially grown on thin base layer 84 through openings 90 in mask 86. After etching, mask 86 can be removed and base contact regions 92 can be deposited in the recesses between emitter regions 88.

In another embodiment, diodes can be made by selectively etching SiC of a first conductivity type and thereafter selectively re-growing SiC of a different conductivity type in the etched region using the same mask, thereby forming a pn junction diode. This technique would result in a planar pn diode in SiC without the use of ion implantation and its subsequent required annealing.

Figure 7A:
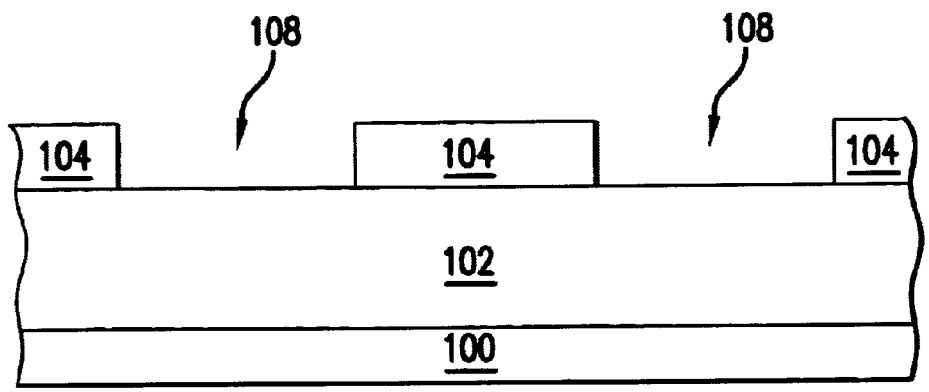
FIGS. 7A–7C illustrate the manufacture of a planar SiC semiconductor device made by etching and selective growth using the same mask.
Figure 7B:
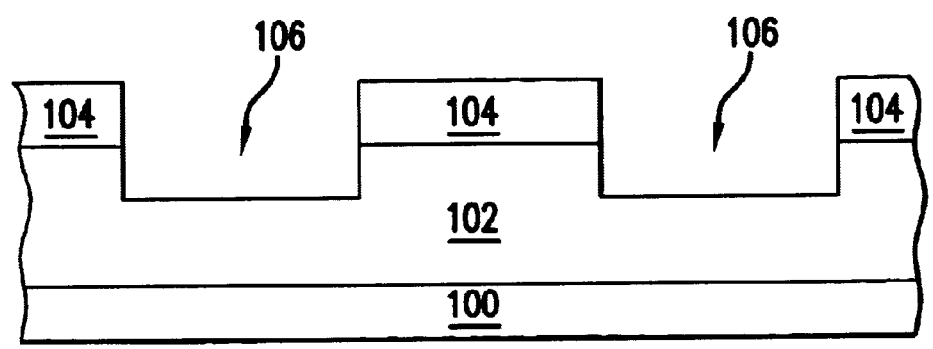
Figure 7C:
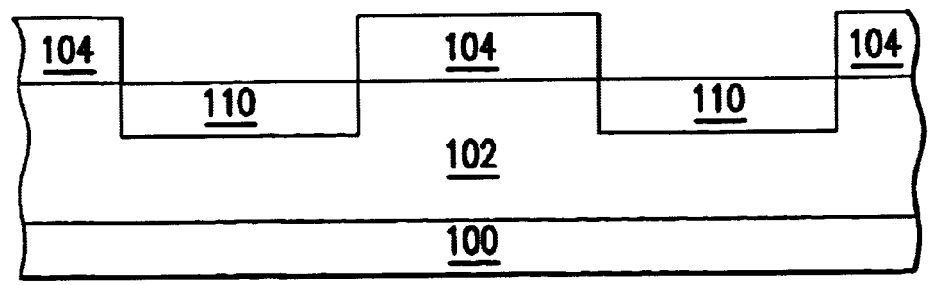

A method of making a diode by selective etching and epitaxial growth using the same mask is illustrated in FIGS. 7A–7C. As shown in FIG. 7A, a drift layer 102 is disposed on a SiC substrate layer 100. A mask 104 is also shown positioned on the exposed surface of drift layer 102. In FIG. 7B, recesses 106 are shown etched in drift layer 102 through openings 108 in mask 104. After etching, SiC having a conductivity type different than that of drift layer 102 can be epitaxially grown 110 in recesses 106 to form the structure shown in FIG. 7C.

Figure 8:
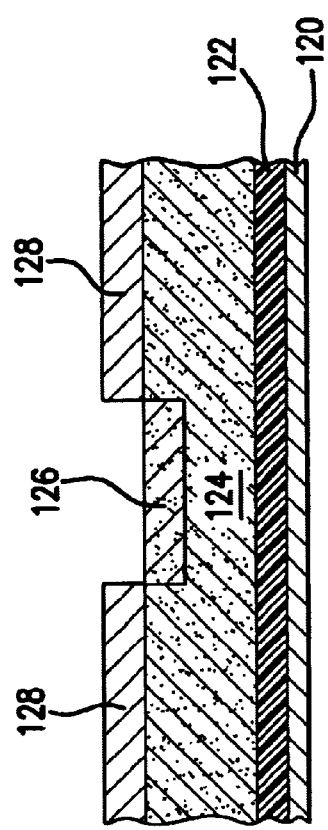
FIG. 8 shows the cross section of a planar diode made by the method illustrated in FIGS. 7A–7C.

A planar diode made by the method illustrated in FIGS. 7A–7C is shown in FIG. 8. The diode shown in FIG. 8 comprises substrate layer 122, drift layer 124 and a re-grown SiC region 126 having a conductivity type different than that of drift layer 124. A metal contact 120 is shown disposed on substrate layer 122. The mask 128 used the etch the recess and selectively re-grow region 126 is also shown. According to a preferred embodiment of the invention, the drift layer will comprise a lightly doped SiC material and re-grown region 126 will comprise a heavily doped SiC material of a conductivity type different than that of the drift layer. For example, the drift layer can be an $n^-$ SiC material and the re-grown region 126 can be a $p^+$ SiC material. Alternatively, the drift layer can be a $p^-$ SiC material and the re-grown region 126 can be an $n^+$ SiC material. The PN diode shown in FIG. 8 can be made using an etch mask. Any conventional etch mask that is capable of withstanding the processing conditions encountered during etching and epitaxial growth can be used. Exemplary etch mask materials include molybdenum and dielectric materials.

In a further embodiment, the method illustrated in FIGS. 7A–7C can be employed to form a single or multiple-zoned region at the edge of a diode or other semiconductor device. In this manner, a guard ring or Junction Termination Extension (JTE) (i.e., edge termination structure) can be formed. For example, a planar edge termination structure for a high voltage SiC device (e.g., a diode or BJT) could be provided to increase blocking voltage.

Figure 9:
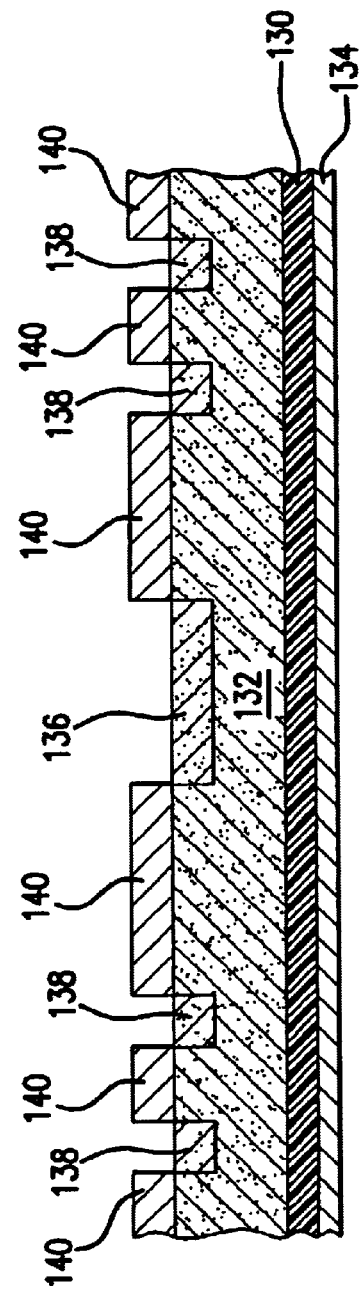
FIG. 9 shows the cross section of a planar diode having an edge termination structure wherein the diode and the edge termination structure are made by the method illustrated in FIGS. 7A–7C.

FIG. 9 illustrates the cross-section of a planar structure comprising a diode with re-grown guard rings for edge termination. In FIG. 9, a drift layer 132 is shown disposed on semiconductor substrate 130. A metal contact layer 134 is also shown disposed on the bottom surface of substrate 130. A diode region 136 and guard rings 138 are shown. As can be seen from FIG. 9, diode region 136 and guard rings 138 form a planar structure. That is, the exposed surfaces of drift layer 132 as well as the exposed surfaces of guard rings 138 and diode region 136 are approximately co-planar. In FIG. 9, the mask 140 used to etch the recesses and selectively re-grow diode region 136 and guard rings 138 is also shown.

Edge termination structures according to the invention can be made without the use of ion-implantation. Ion implantation requires a post-implant high temperature annealing process for activation of the dopants. The high-temperature annealing process can induce damage in the device by, for example, causing undesirable diffusion of dopants. Additionally, elimination of an additional step simplifies the process and thereby reduces the cost of manufacture.

Suitable donor materials for doping SiC include nitrogen and phosphorous. Nitrogen is a preferred donor material according to the invention. Suitable acceptor materials for doping silicon carbide include boron and aluminum. Aluminum is a preferred acceptor material. The above materials are merely exemplary, however, and any donor or acceptor material which can be doped into silicon carbide can be used according to the invention.

The doping levels and thicknesses of the various layers of the semiconductor devices according to the invention can be varied to produce a device having desired characteristics for a particular application. Unless otherwise indicated, heavily doped (n+ or p+ doped) in the context of the invention corresponds to dopant concentrations of $10^{18}$ atoms·cm$^{-3}$ or greater, lightly doped (n− or p− doped) corresponds to dopant concentrations of $5 \times 10^{16}$ atoms·cm$^{-3}$ or less and moderately doped (n or p doped) corresponds to dopant concentrations of between $5 \times 10^{16}$ atoms·cm$^{-3}$ and $10^{18}$ atoms·cm$^{-3}$.

According to a preferred embodiment of the invention, the drift layer is a SiC layer lightly doped with a donor material (e.g., n− doped) and the substrate layer is SiC heavily doped with a donor material (e.g. n+ doped). For SiC BJTs, the thin base layer is preferably p− doped, the base contact regions are preferably p+ doped and the emitter regions are preferably n+ doped. For SITs, the source regions are preferably n+ doped and the gate regions are preferably p or p+ doped.

Doping of SiC with the dopant (e.g., donor or acceptor) is preferably performed in-situ during epitaxial growth of the SiC layers. The SiC layers can be formed by any epitaxial growth method known in the art, including CVD, molecular beam and sublimation epitaxy. According to preferred embodiment of the invention, the doped SiC layers according to the invention are formed by doping in-situ during epitaxial growth wherein dopant atoms are incorporated into the silicon carbide during growth.

From the foregoing, it will be appreciated that, although specific embodiments of the invention have been described herein for purposes of illustration, various modifications may be made without deviating from the spirit and scope of the invention.

What is claimed is:

1. A method of making a silicon carbide bipolar junction transistor comprising a SiC semiconductor substrate layer of a first conductivity type, a SiC drift layer of the first conductivity type disposed on the substrate layer, a SiC base layer of a second conductivity type different than the first conductivity type disposed on the drift layer, and one or more SiC emitter regions of the first conductivity type disposed on the base layer, the method comprising:

forming a SiC emitter layer on the base layer, wherein the base layer is disposed on the drift layer and wherein the drift layer is disposed on the substrate layer;

positioning a mask on the emitter layer;

selectively etching the emitter layer through openings in the mask to form raised emitter regions separated by etched regions; and selectively forming SiC base contact regions in the etched regions through the openings in the mask.

2. The method of claim 1, wherein the SiC base contact regions are formed by selective epitaxial growth of SiC of the second conductivity type.

3. The method of claim 1, wherein the SiC base contact regions are formed by ion implantation.

4. A SiC bipolar junction transistor made by the method of claim 1.

5. A method of making a silicon carbide bipolar junction transistor comprising a SiC semiconductor substrate layer of a first conductivity type, a SiC drift layer of the first conductivity type disposed on the substrate layer, a SiC base layer of a second conductivity type different than the first conductivity type disposed on the drift layer, and one or more SiC emitter regions of the first conductivity type disposed on the base layer, the method comprising:

positioning a mask on the base layer, wherein the base layer is disposed on the drift layer and wherein the drift layer is disposed on the substrate layer; and selectively depositing SiC of the first conductivity type on the base layer through openings in the mask to form the emitter regions.

6. The method of claim 5, further comprising:

removing the mask to expose portions of the base layer; and selectively forming SiC base contact regions on exposed portions of the base layer.

7. A SiC bipolar junction transistor made by the method of claim 5.

8. A method of making a silicon carbide static induction transistor comprising a SiC semiconductor substrate layer of a first conductivity type, a SiC drift layer of the first conductivity type disposed on the substrate layer, a plurality of SiC gate regions of a second conductivity type different than the first conductivity type disposed on the drift layer, and a plurality of SiC source regions of the first conductivity type disposed on the drift layer, the method comprising:

forming a source layer of SiC of the first conductivity type on the drift layer, wherein the drift layer is disposed on the substrate layer;

positioning a mask on the source layer;

selectively etching the source layer through openings in the mask to form raised source regions separated by etched regions; and selectively forming the SiC gate regions in the etched regions through the openings in the mask.

9. The method of claim 8, wherein selectively forming the SiC gate regions comprises selectively depositing SiC of the second conductivity type in the etched regions through the openings in the etch mask.

10. The method of claim 8, wherein selectively forming the SiC gate regions comprises epitaxially growing SiC of the second conductivity type in the etched regions through the openings in the etch mask.

11. The method of claim 8, wherein selectively forming the SiC gate regions comprises ion implantation.

12. The method of claim 8, further comprising forming ohmic contacts on the substrate layer opposite the drift layer and on the source regions and gate regions.

13. A SiC static induction transistor made by the method of claim 8.

14. A method of making a silicon carbide semiconductor device comprising a SiC semiconductor substrate layer of a first conductivity type, a SiC drift layer of the first conductivity type disposed on the substrate layer, and one or more regions of SiC of a second conductivity type different than the first conductivity type disposed on the drift layer, the method comprising:

positioning a mask on the drift layer, wherein the drift layer is disposed on the substrate layer;

selectively etching into the drift layer through openings in the mask to form etched regions; and depositing SiC of the second conductivity type in the etched regions through the openings in the mask to form the SiC regions of the second conductivity type.

15. The method of claim 14, wherein selectively etching comprises etching a central opening and one or more trenches circumscribing the central opening, and wherein depositing SiC comprises depositing SiC of the second conductivity type in the central opening and in the one or more trenches.

16. The method of claim 15, wherein the SiC of the second conductivity type deposited in the central opening is a diode and wherein the SiC of the second conductivity type deposited in the trenches forms an edge termination structure for the diode.

17. The method of claim 14, wherein exposed surfaces of the one or more SiC regions of the second conductivity type are approximately coplanar with exposed surfaces of the drift layer.

18. A SiC semiconductor device made by the method of claim 14.

19. The SiC semiconductor device of claim 18, wherein the device is a diode.

20. A SiC semiconductor device made by the method of claim 15.

21. A method of making a silicon carbide semiconductor device comprising a SiC semiconductor substrate layer of a first conductivity type, first and second SiC drift layers of the first conductivity type disposed on the substrate layer, and one or more SiC gate regions of a second conductivity type different than the first conductivity type formed between the first and second drift layers, the method comprising:

positioning a mask on the first drift layer, wherein the first drift layer is disposed on the substrate layer;

selectively implanting ions into the drift layer through openings in the mask to form the gate regions;

removing the mask; and depositing the second drift layer on the implanted surface of the first drift layer to form embedded gate regions.

22. The method of claim 21, further comprising:

forming one or more source regions of SiC of the first conductivity type on the exposed surface of the second drift layer.

23. The method of claim 22, further comprising:

forming a via through the second drift layer to expose the one or more gate regions; and providing an electrical contact to the one or more gate regions through the via.

24. The method of claim 23, further comprising forming ohmic contacts on the substrate layer opposite the drift layer and on the source regions.

25. A semiconductor device made by the method of claim 21.

26. A semiconductor device made by the method of claim 24.

27. The semiconductor device of claim 26, wherein the device is a static induction transistor.

* * * * *

UNITED STATES PATENT AND TRADEMARK OFFICE
CERTIFICATE OF CORRECTION

PATENT NO. : 6,767,783 B2
DATED : July 27, 2004
INVENTOR(S) : Jeffrey B. Casady et al.

It is certified that error appears in the above-identified patent and that said Letters Patent is hereby corrected as shown below:

<u>Column 1,</u>
Line 13, please insert the following:
-- This invention was made with U.S. Government support under Contract Number F33615-01-D-2103 awarded by the U.S. Air Force. The U.S. Government has certain rights in this invention. --

Signed and Sealed this

Twelfth Day of April, 2005

JON W. DUDAS
*Director of the United States Patent and Trademark Office*